United States Patent [19]

Tu

[11] Patent Number: 6,001,514
[45] Date of Patent: Dec. 14, 1999

[54] MASK FOR AN EXPOSURE PROCESS USING X-RAY

[75] Inventor: Lin-Hsin Tu, Taipei, Taiwan

[73] Assignee: United Microelectronics Corp., Taipei, Taiwan

[21] Appl. No.: 09/111,426

[22] Filed: Jul. 7, 1998

[30] Foreign Application Priority Data

Jun. 4, 1998 [TW] Taiwan ................................. 87108817

[51] Int. Cl.⁶ ................................ G03F 9/00; G21K 5/00
[52] U.S. Cl. ................................................. 430/5; 378/35
[58] Field of Search ........................ 430/5, 322; 378/34, 378/35

[56] References Cited

U.S. PATENT DOCUMENTS 4,873,162  10/1989  Yoshioka et al. ........................ 430/5

*Primary Examiner*—S. Rosasco
*Attorney, Agent, or Firm*—Thomas, Kayden, Horstemeyer & Risley

[57] ABSTRACT

A fabrication process for a mask used in exposure processes using x-rays, which includes first forming and patterning an absorber, and then forming a membrane over it. The fabrication process can avoid the use of a selective etching process on the absorber and the membrane. The mask, according to the invention, can prevent transferred pattern misalignment or displacement or misplacement, and exposure to secondary electrons as well.

15 Claims, 6 Drawing Sheets

MASK FOR AN EXPOSURE PROCESS USING X-RAY

CROSS-REFERENCE TO RELATED APPLICATION

This application claims the priority benefit of Taiwan application serial no. 87108817, filed Jun. 4, 1998, the full disclosure of which is incorporated herein by reference.

BACKGROUND OF THE INVENTION

1. Field of the Invention

This invention relates to a mask used for an exposure process, and more particularly, to a mask used for an exposure process using x-ray.

2. Description of Related Art

In a photolithography process, in addition to a light source, a mask with a pattern of circuits, for transferring the pattern onto a photoresist layer, is also required. Since a whole semiconductor wafer is wasted if any single processing step goes wrong, inspection steps are required before proceeding with any fabrication step. As a result, it is very important for the fabrication of semiconductor devices to correct the alignment of the layers before every photolithography process to avoid improperly transferring the patterns.

Referring to FIG. 1A through FIG. 1E, a fabrication process of a conventional mask used in a x-ray lithography mask process is shown.

First, as shown in FIG. 1A, two membranes 3 and 4, such as silicon-rich nitride, are formed on the first surface and the second surface of an experimental silicon wafer 2. Then, referring to FIG. 1B, an etching process, such as an etching process using KOH, is performed on the middle portion of membrane 4 and on wafer 2 itself. The etching process is stopped when membrane 3 is exposed.

Referring to FIG. 1C and FIG. 1D, an absorber 6 is formed on the membrane 3. Next, photoresist layer 8 is deposited on the absorber 6 and patterned, and the unwanted portions of the absorber are etched off. Then, a photolithography process is performed to transfer a desired pattern onto the absorber 6.

Referring to FIG. 1E, after the removal of the patterned photoresist 8, an anti-reflection layer 10 is then deposited on the patterned absorber 6, and an x-ray mask is completed. The anti-reflection layer 10 prevents the transfer of patterns caused by exposure to secondary electrons due to excessive x-ray energy.

Because the absorber 6 is capable of absorbing high-energy x-rays, the density of the absorber is relatively high. As a result, the selective etching process on the membrane 3, which has a thickness of only about 1am, and the absorber 6 is accomplished at a very low yield, and the fabrication cost is increased accordingly.

Furthermore, after several exposures to x-rays, a thermal stress occurs on the transferred pattern of the absorber 6, and twists the membrane 3, causing misalignment. As a result, patterns cannot be reliably or precisely transferred by photolithography processes.

The fabrication process of another conventional mask for x-ray is shown in FIG. 2A through FIG. 2E.

First, referring to FIG. 2A and FIG. 2B, membranes 3 and 4, such as silicon-rich nitride, are formed respectively on the first surface and the second surface of an experimental silicon wafer. An absorber 6 is then formed on the upper membrane 3.

Referring to FIG. 2C, a photoresist layer 8 is deposited on the absorber 6 and patterned, and the unwanted portions of the absorber are etched off. Following that, a photolithography process is performed to transfer a desired pattern onto the absorber 6. Then, referring to FIG. 2D, after the removal of the patterned photoresist 8, an anti-reflection layer 10 is deposited on the patterned absorber 6, and a mask for x-ray is completed. The anti-reflection layer 10 is used to prevent the transfer of patterns caused by exposure to secondary electrons due to excessive x-ray energy.

And then, referring to FIG. 2E, an etching process is performed on the middle portion of the lower membrane 4 and the into the silicon wafer 2. The etching process, such as one using KOH, removes the middle portion of the silicon wafer 2, and stops as it reaches the upper membrane 3 to accomplish the fabrication of an x-ray mask.

The previously mentioned drawbacks of a conventional x-ray mask also happen to the second conventional x-ray mask during the selective etching process and after several x-ray exposures.

SUMMARY OF THE INVENTION

It is therefore an objective of the present invention to provide a x-ray mask wherein the membrane is protected from being etched and damaged during the etching process performed on the absorber. In the invention, an absorber is formed on the silicon wafer first, and patterned by an etching process before the deposition of a membrane which covers the transferred pattern, so damage to the membrane due to over-etching is avoided.

It is another an objective of the present invention to provide a patterned x-ray mask. The pattern is covered by the membrane, so the pattern is supported by the membrane from the sides. With the support of the membrane, the misalignment of the pattern due to thermal stress on the absorber after several x-ray exposures can be prevented.

In accordance with the foregoing and other objectives of the present invention, the invention provides a x-ray mask including a silicon wafer, an absorber, a transferred pattern, a membrane, and an etched opening. The silicon wafer has a first surface and a second surface. The absorber is located on the first surface of the silicon wafer on which a transferred pattern is also formed, using an etching process. The membrane is formed on the first surface of the silicon wafer and covers the transferred pattern. The etched opening is formed on the second surface of the silicon wafer and exposes the membrane and the transferred pattern.

BRIEF DESCRIPTION OF DRAWINGS

The invention can be more fully understood by reading the following detailed description of the preferred embodiments with reference made to the accompanying drawings, wherein.

DETAILED DESCRIPTION OF PREFERRED EMBODIMENTS

Figure 1A:
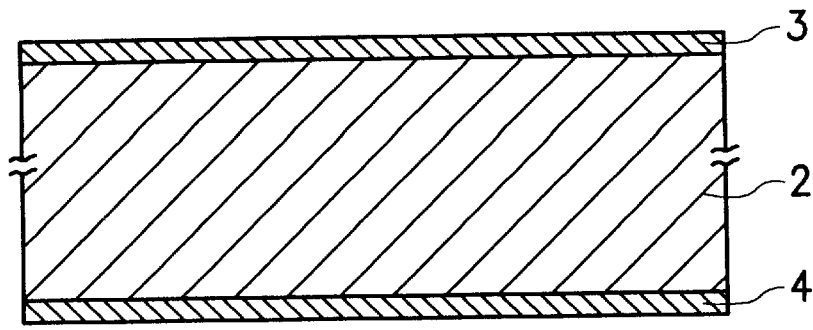
FIGS. 1A through 1E are sectional diagrams showing a conventional fabrication process of an x-ray mask.
Figure 1B:
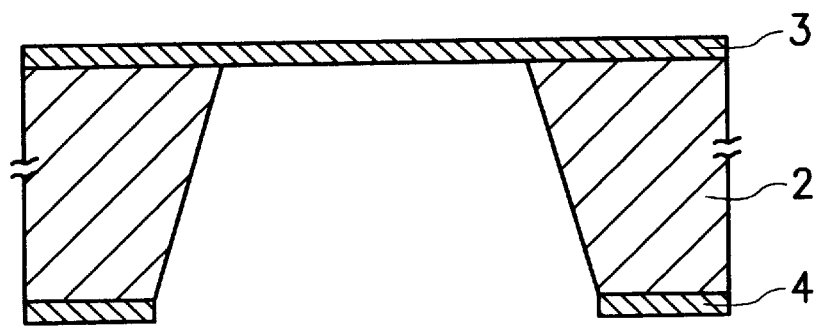
Figure 1C:
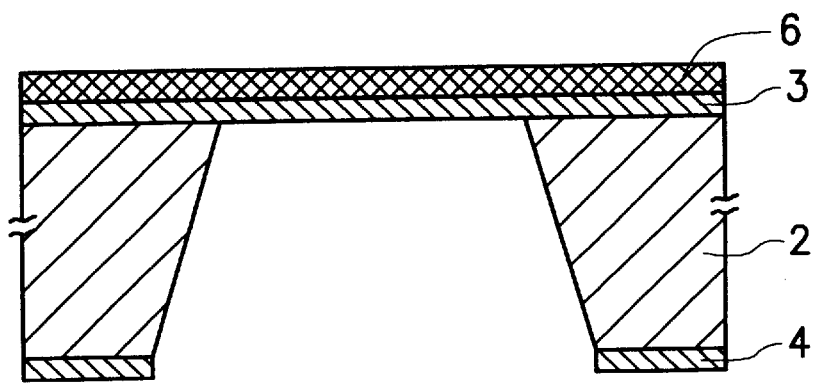
Figure 1D:
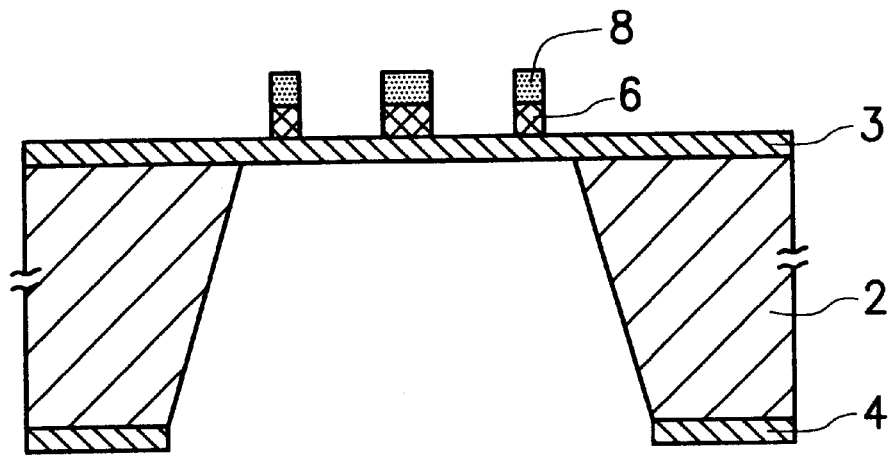
Figure 1E:
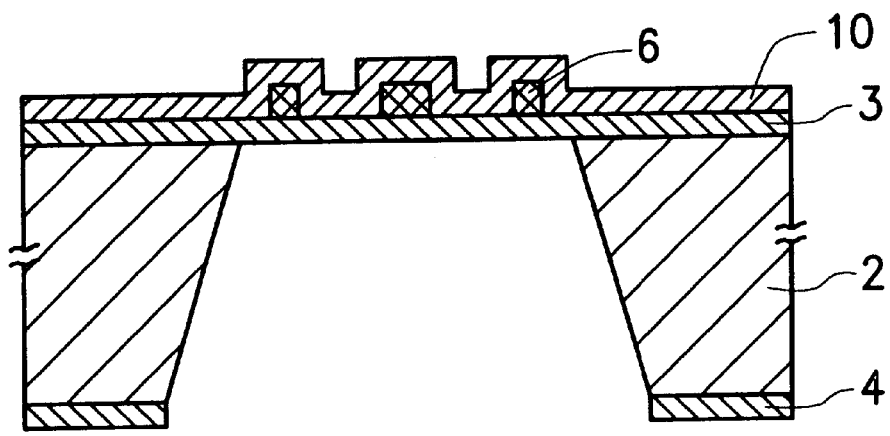
Figure 2A:
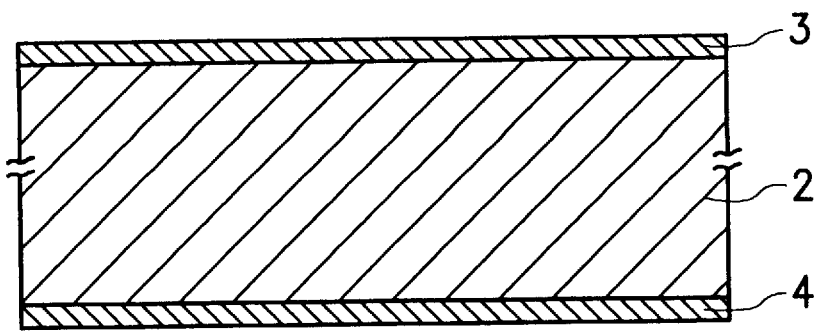
FIGS. 2A through 2E are sectional diagrams showing another conventional fabrication process of an x-ray mask.
Figure 2B:
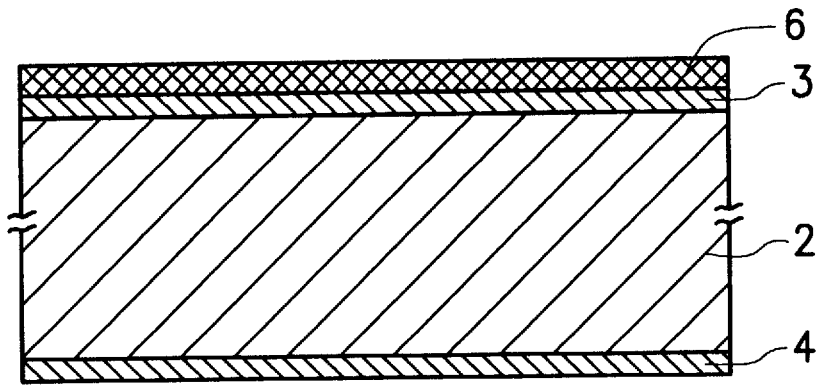
Figure 2C:
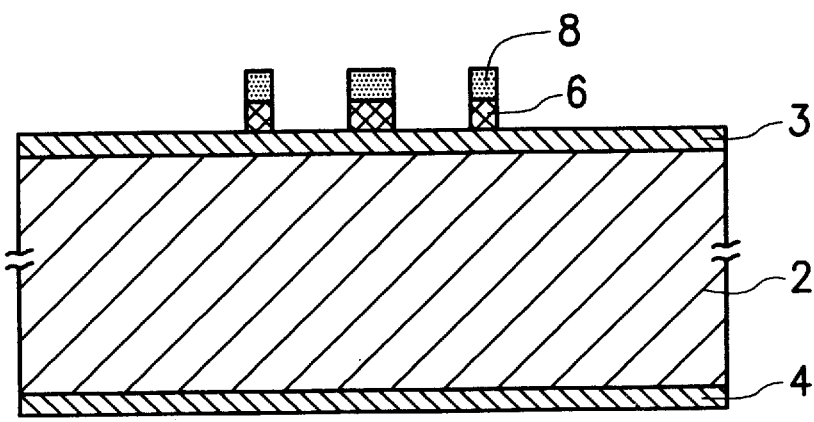
Figure 2D:
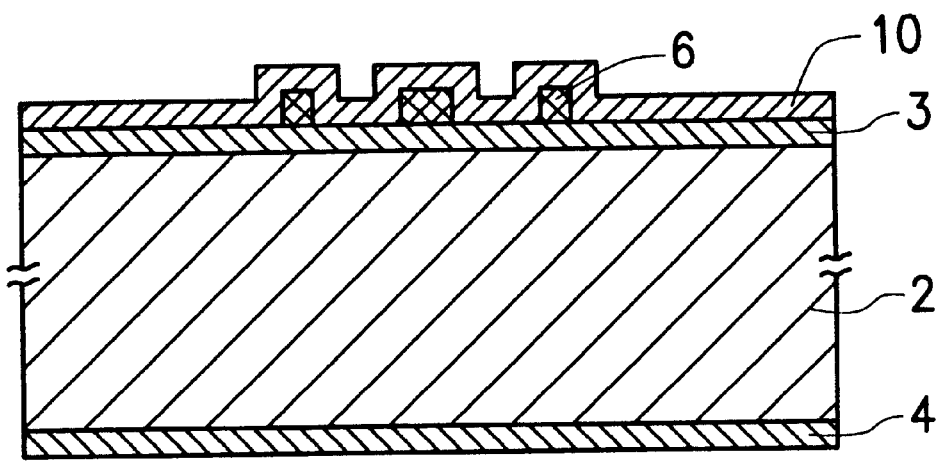
Figure 2E:
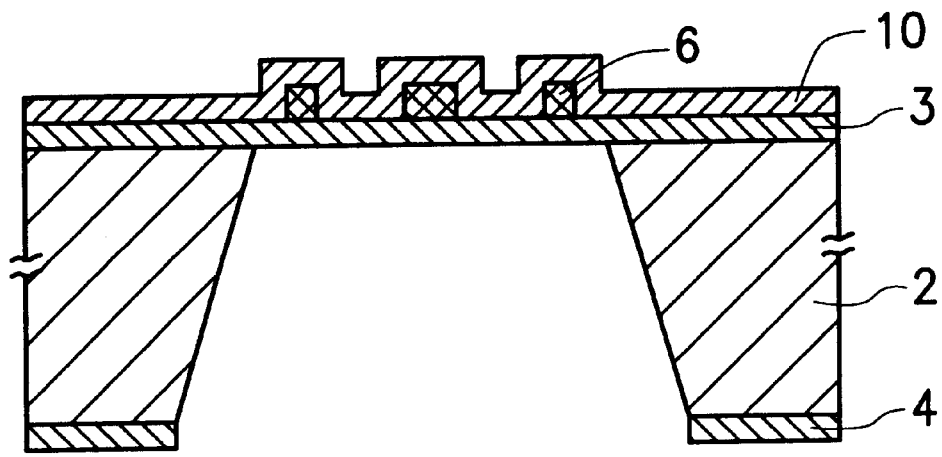
Figure 3A:
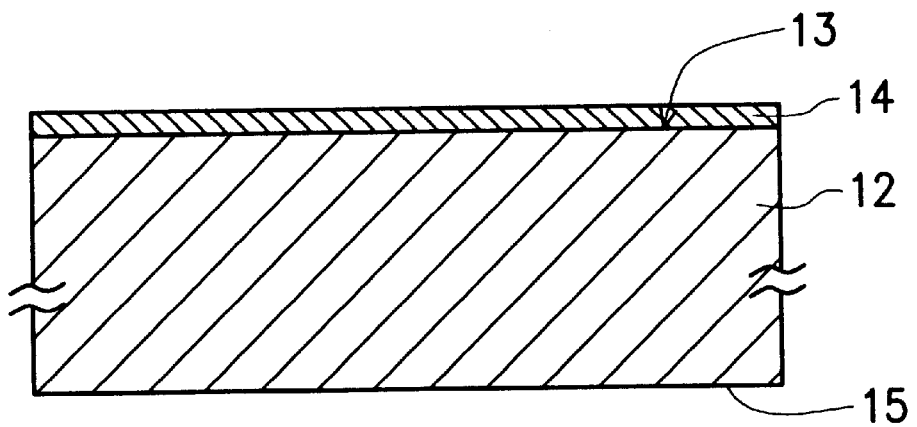
FIGS. 3A through 3D are sectional diagrams showing a fabrication process of an x-ray mask used in a preferred embodiment according to the invention.
Figure 3B:
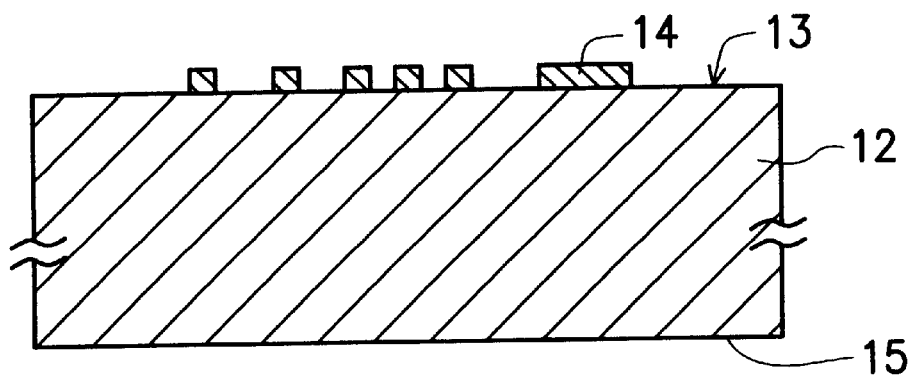

The invention provides a new fabrication process for an x-ray mask, as shown in FIGS. 3A through 3D. Referring to FIG. 3A, a silicon wafer 12, such as a 4-inch experimental silicon wafer, having a first surface 13 and a second surface 15 is provided. An absorber 14, used to absorb x-rays, is formed on the first surface 13 of the silicon wafer 12. Referring next to FIG. 3B, a dry etching process, such as one that uses reactive ions, is carried out on the absorber 14 to form a desired transferred pattern. Because the membrane is not yet formed, the problems due to over-etching in a selective etching process on a membrane and an absorber in a conventional fabrication process do not appear. The failure rate, resulting from damage to a membrane with a thickness of only about 1 µm is dramatically improved, thus reducing production costs.

Figure 3C:
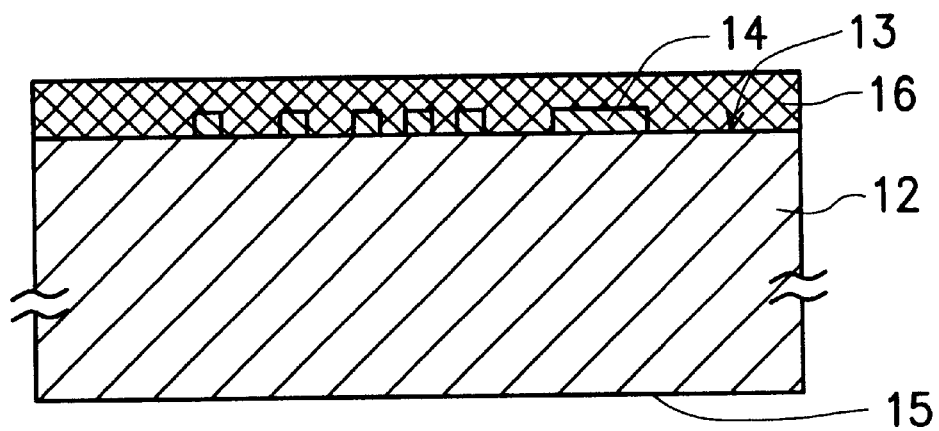

Next, referring to FIG. 3C, a membrane 16, with a thickness of about 1 µm, is formed on the silicon wafer 12 and the patterned absorber 14, to cover the transferred pattern. The membrane 16 includes, for example, silicon-rich nitride. The transferred pattern formed on the absorber 14 is, according to the invention, evenly covered by the membrane 16, unlike the conventional one that is formed on the membrane 3. The misalignment caused by thermal stress to the absorber 14 during the exposure process is reduced because of the support the membrane 16 provides from the sides. A anti-reflection layer (not shown) formed on the membrane 16 later on can further prevent exposure to secondary electrons caused by high energy x-rays.

Figure 3D:
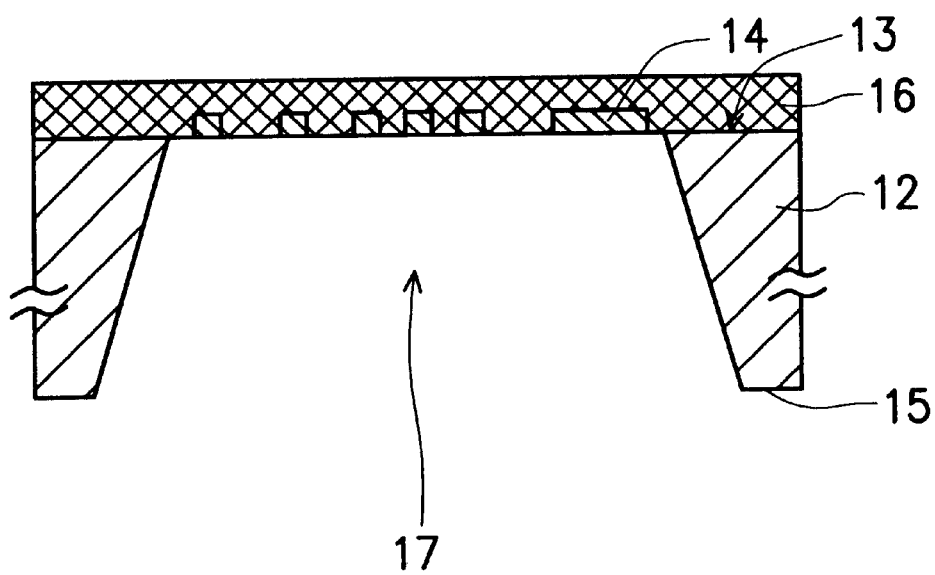

Referring to FIG. 3D, an etching process using KOH is performed at the middle of the second surface 15 of the silicon wafer 12 toward the first surface 13 to form an etched opening 17 and expose the membrane 16 and the transferred pattern on the absorber 14.

Therefore, it is a specificity of the invention that an absorber is formed before the membrane. After the absorber is patterned, the membrane is then formed to cover the patterned absorber. As a result, a selective etching process on the absorber and the membrane is not necessary, damage is prevented, and the yield of the x-ray mask is accordingly increased.

Furthermore, it is another specificity of the invention that the misalignment that occurs on the transferred pattern is reduced due to the presence of the side support from the membrane. Because the transferred pattern is covered and supported from the sides by the membrane the misalignment caused by the thermal stress on the absorber after several exposure processes is eliminated. In addition, an extra anti-reflection layer prevents exposure to the secondary electrons caused by high-energy x-rays as well.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A mask for an exposure process using x-rays comprising:
   a silicon wafer, having a first surface and a second surface;
   an absorber, formed on the first surface;
   a transferred pattern, formed on the first surface by performing a first patterning process on the absorber;
   a membrane, covering the first surface and the transferred pattern; and
   an etched opening, formed in the silicon wafer to expose both the membrane and the transferred pattern at the first surface, wherein the etched opening is formed by performing a second patterning process from the second surface.

2. The mask of claim 1, wherein the silicon wafer includes a 4-inch silicon wafer.

3. The mask of claim 1, wherein the absorber is used to absorb x-rays.

4. The mask of claim 1, wherein the first patterning process to form the transferred pattern comprises a dry etching process.

5. The mask of claim 4, wherein the dry etching process includes a reactive ion etching.

6. The mask of claim 1, wherein the second patterning process includes using an etchant of KOH.

7. The mask of claim 1, wherein the membrane has a thickness of about 1 µm.

8. The mask of claim 1, wherein the membrane includes polysilicon nitride.

9. The mask of claim 1, wherein the membrane comprises silicon-rich nitride.

10. A mask for an exposure process using x-rays comprising:
    a membrane, which is damascened with an absorber pattern from a selected surface of the membrane, so that both the membrane and the absorber pattern are simultaneously exposed on the selected surface where the surface is damascened; and
    a silicon layer located on the selected surface of the membrane at a rim portion without covering the absorber pattern.

11. The mask of claim 10, wherein the silicon layer comprises a thickness of four inches.

12. The mask of claim 10, wherein the absorber pattern is used to absorb X-rays.

13. The mask of claim 10, wherein the membrane comprises a thickness of about one micron.

14. The mask of claim 10, wherein the membrane comprises silicon-rich nitride.

15. The mask of claim 10, wherein the membrane comprises polysilicon nitride.

* * * * *